United States Patent [19]

Perrot et al.

[11] Patent Number: 4,835,382

[45] Date of Patent: May 30, 1989

[54] OPTICAL CODE READING DEVICE

[75] Inventors: Jean-Claude Perrot, Montigny-en-Cormeilles; Jacques Taillebois, Plaisir, both of France

[73] Assignee: M.C.B., Courbevoie, France

[21] Appl. No.: 870,793

[22] Filed: Jun. 5, 1986

[30] Foreign Application Priority Data

Jun. 14, 1985 [FR] France ................. 85 09076

[51] Int. Cl.$^4$ ............... G01D 5/34; H01J 3/14
[52] U.S. Cl. .................. 250/231 SE; 250/237 G; 341/8
[58] Field of Search .......... 250/231 SE, 237 G; 340/347 P; 33/125 A, 125 C; 341/13, 137, 155

[56] References Cited

U.S. PATENT DOCUMENTS

| | | | |
|---|---|---|---|
| 2,966,671 | 12/1960 | Abbott | 340/347 |
| 3,938,890 | 2/1976 | Flavell | 250/231 R |
| 4,110,610 | 8/1978 | Mueller | 250/231 SE |
| 4,137,451 | 1/1979 | Einolf, Jr. | 250/231 SE |
| 4,173,752 | 11/1979 | Yamanaka | 340/347 P |
| 4,311,987 | 1/1982 | Taillebois | 340/347 P |
| 4,312,071 | 1/1982 | Bloch | 371/57 |
| 4,422,065 | 12/1983 | Radomirov et al. | 250/231 SE |
| 4,427,972 | 1/1984 | Haville et al. | 250/231 SE |
| 4,622,461 | 11/1986 | Taillebois | 250/231 SE |
| 4,678,908 | 7/1987 | La Plante | 250/231 SE |
| 4,700,063 | 10/1987 | Hara | 250/231 SE |
| 4,719,346 | 1/1988 | Taillebois et al. | 250/231 SE |
| 4,739,163 | 4/1988 | Gambs et al. | 250/231 SE |

FOREIGN PATENT DOCUMENTS 0102241 3/1984 European Pat. Off. .
1404822 7/1964 France .

OTHER PUBLICATIONS

Walker, "Guarding Against Errors in Optical Encoders", *Machine Design*, vol. 54, No. 24, 10/82, pp. 105-109.

Frank et al., "Precision Shaft-Position Encoders", *IRE Transactions on Instrumentation*, vol. PGI-5, pp. 168-173.

Primary Examiner—David C. Nelms
Assistant Examiner—Michael Messinger
Attorney, Agent, or Firm—Antonelli, Terry & Wands

[57] ABSTRACT

An optical code reading device, including a unit having, for each of the tracks of the coded element, a pair of photodiodes, a differential amplifier receiving the outputs of the photodiodes and the trigger connected to the output of the amplifier, a shift register receiving the outputs from the unit, a control unit, a clock and apparatus for feeding to said unit signals adapted for simulating at will, for each channel, the bit level "0" or the bit level "1".

14 Claims, 5 Drawing Sheets

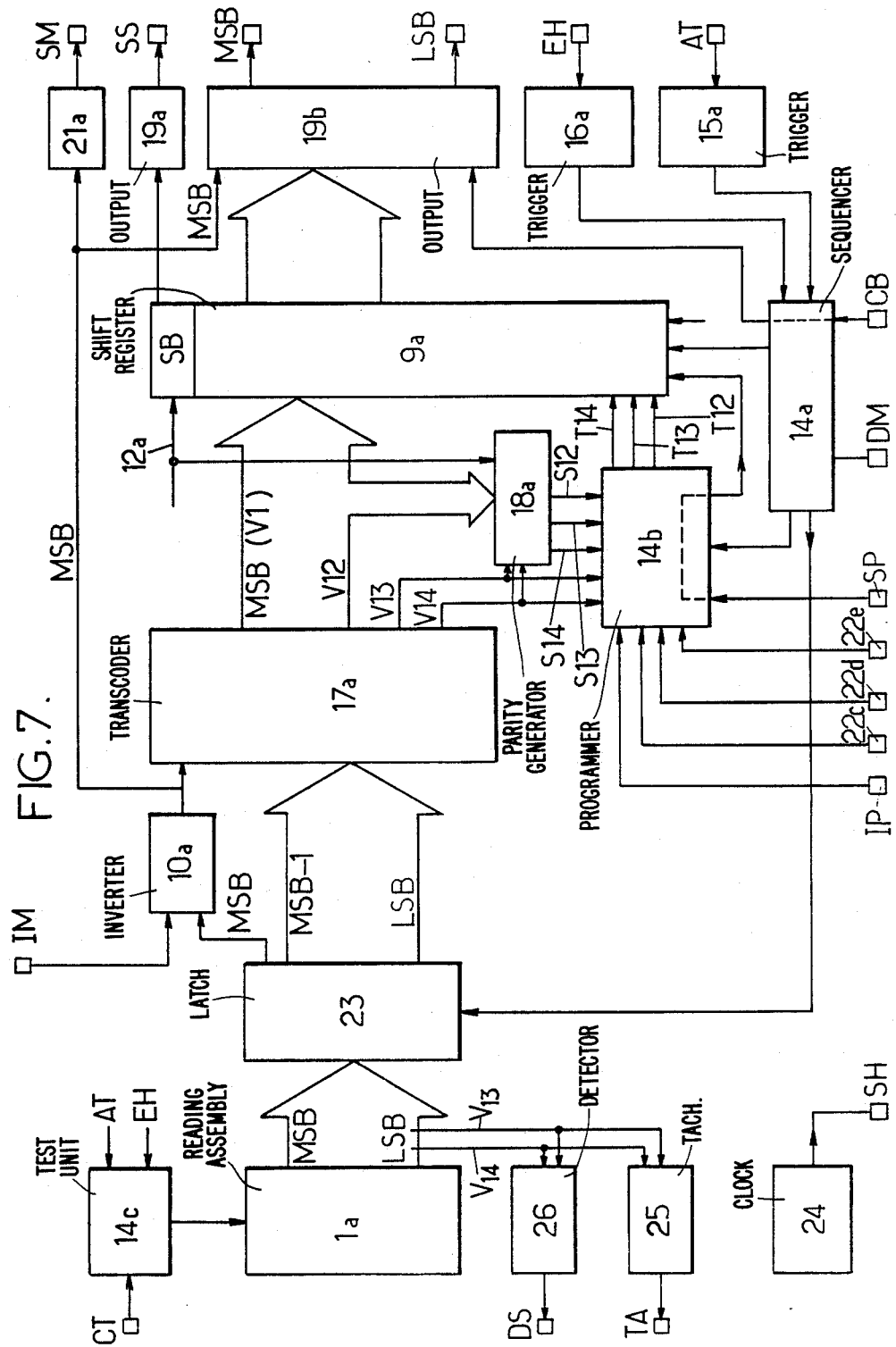

OPTICAL CODE READING DEVICE

BACKGROUND OF THE INVENTION

The present invention relates to a device for the absolute reading of an optical code carried by, more particularly, a disk with coded tracks, the reading taking place in this case by diascopy, that is to say by the differential reading of the transparent zones and of the opaque zones of a disk, disposed in a code known in the art under the name of Gray code.

It is known that such a device comprises—in combination with a disk comprising several concentric tracks each with a succession of fine alternating opaque zones and transparent zones—at least one light source adapted for illuminating the whole of the tracks and a coded reading assembly properly speaking which emits electric pulses representing finally the relative angular position of two elements of an assembly movable with respect to each other, the disk being carried by one of these elements.

Optical code reading devices are more and more widely used, one of their applications (to which the invention particularly applies) being that of determining the angular position of movable elements of a robot, by providing in this case a reading device for each movable element.

Although the invention applies particularly to the reading of a coded disk by diascopy, that is to say by transparency, it may also be applied to the reading of a coded disk by reflection and also to the reading of a coded strip by determining in this case not an angular position but a relative linear movement between two elements, one of which is movable in translation with respect to the other, the strip being carried by one of these two elements.

In what follows, the present description will be limited to the case of diascopy reading of a coded disk comprising several tracks using the Gray code.

Generally, a device for reading a coded disk comprises on the one hand, at least one light source formed either by a filament lamp emitting light over a wide spectrum comprising the visible and the near infrared(-the near infrared being the zone of maximum sensitivity for photoconductors, particularly silicon photoconductors), the filament lamp illuminating, through an appropriate optical system, the whole of the tracks of the disk, or an assembly of light emitting diodes emitting generally in the near infrared (in the 0.8 to 0.9 micron band), on the other hand, a code reading assembly properly speaking, which cooperates with a coded disk and the light source or the light sources and which comprises first of all an array of photodetectors in number equal to the number of tracks, these photodetectors being formed more particularly by photodiodes or phototransistors which are either in the form of discrete components, or disposed in a common chip; in both cases, the number of photodetectors is equal to the number of light emitting diodes when the light source is formed by such diodes.

The photodetectors of the prior art deliver very weak signals and therefore they are followed by amplifiers, particularly by commercial operational amplifiers formed by integrated circuits with discrete components wired on a printed circuit, or else specific "prediffused" or hybrid circuits are used comprising in general as many amplifiers as there are coded tracks and so photoconductors (hereafter we will speak of reading channels, namely a channel for each track of the coded disk).

In each channel, the amplifier is followed usually by a shaping circuit generally formed by a trigger of the Schmitt trigger type outputting steep front pulses in response to each transparent zone of the track corresponding to the channel in question. Advantageously, in the same chip is disposed the Schmitt trigger assembly, and even more advantageously still in the same chip are disposed the amplifier asembly and the Schmitt trigger assembly either using the hybrid technique, or using the technique of prediffused circuits. There must further be provided for each Schmitt trigger, i.e. for each channel, an adjustment element for adjusting the switching threshold of the trigger so as to ensure, despite the variations in sensitivity of the photodetectors, correct operation of each channel and good switching accuracy of the subsequent electronic units.

In fact, it is necessary, for a large number of applications of code reading devices, to carry out logic processing before transmission of the information obtained for each channel by means of a photodetectoramplifier-Schmitt chain.

There are more particularly provided in general:

uncertainty removal means (in particular in the case of absolute multiturn coders or monoturn coders, when the disk is coded not with the Gray code, but with the natural binary code), these means being formed by commercially available integrated logic circuits;

means for transcoding the Gray code (which is the one appearing on the coded disk) into natural binary code (which is then the output code of the reading device) for facilitating subsequent use of the data from the reading device, these means being formed by commercially available "exclusive OR" circuits;

means for generating a parity bit for validating the transmission of a code when the number of bits is comformable (either even, or uneven, depending on the convention), particularly when the output of the reading device is a series output (after transformation of the parallel outputs of the Schmitt triggers into a series output ), these means being formed generally by an assembly of commercially available "exclusive OR" units;

means for transforming parallel outputs into a series output for reducing the number of connecting wires being the output of a reading device and the assembly using the position information, these means being formed by a commercially available shift register;

means for shifting the origin for replacing the fine mechanical setting of the disk by adjustment of the electric zero, these means being formed by coded switches.

The transmission of the information from the reading device is made conventionally either by a series transmission, using as interface circuits line emitters and receivers which are formed by commercial chips, or by parallel transmission of the information from the reading device over a "bus", then using a three state output (the high state not comprising any information output, whereas the other two states represent respectively the "0" bit and the "1" bit), or an output of the "open collector" type, for each channel, using commercially available circuits.

Finally, the power supply voltage is adjusted and filtered inside the reading device and the light source.

It is further necessary, in most cases, to compensate for the fluctuations or drifts of the single light source or of the light sources so as to ensure correct operation of the assembly over a wide temperature range.

The assembly comprising the power supply, its regulation and its filtration, on the one hand, and compensation of the fluctuations of the light source or sources, on the other, is formed conventionally by means of commercially available components.

It will be readily understood that the reading assembly which has just been described above requires, in the usual construction, a large number of components which, once wired on a printed circuit, occupy a considerable volume and are relatively expensive, while offering limited reliability.

To overcome these drawbacks, it has been proposed to provide hybridization of the electronic part (amplifiers, Schmitt triggers, logic means), or else to construct the electronic part in the form of several large functional blocks, constructing each of these blocks in the form of a prediffused circuit, or else combining hybridization and prediffused circuits. These three types of solutions reduce the space required and improve the reliability, but do not practically reduce the price of the assembly of the code reading device (light source and associated reading device properly speaking).

The present invention aims at simultaneously improving the three above mentioned factors (space required, reliability and cost) of the known reading devices, by reducing the space required, increasing the reliability and reducing the cost, while further allowing the assembly of the reader to be tested without increasing the complexity of the system.

SUMMARY OF THE INVENTION

For this, in accordance with the invention the different opto-electronic (photodetectors), analog (amplifiers, etc), logic (triggers, gates, etc) and interfaces (three state gates, etc) components are formed so as to be able to integrate these components in a chip, or possibly a reduced number of silicon chips, while further providing on this or these chips means for testing the reading assembly properly speaking and possibly means providing other functions. Thus the size and cost of the reading device is considerably reduced while increasing the reliability and reducing the fluctuations.

The present invention provides then an optical code reading device, for cooperating with an element in relative movement with respect to this reading device and comprising a series of n coded tracks with a succession of elementary zones of two types of retransmission of the light received—which comprises means for illuminating the series of tracks, and illumination determination means for determining whether light is retransmitted by an elementary zone observed of each of the tracks or not, this reading device being characterized in that it cooperates with a single light source for illuminating the tracks and a coded element which comprises, in addition to the series of n coded tracks, a second series of n tracks, each of these latter tracks being coded complementarily in relation to one of the tracks of the first series, and in that the illumination determination means are carried by 1 to p chips, p being a small integer and comprise in combination:

on the one hand, for each of the tracks of the coded element, a pair of photodiodes, a differential amplifier whose two inputs receive the signals emitted by the two photodiodes, a trigger giving a steep leading edge to the signals received from the output of the differential amplifier; and on the other hand, a shift register with parallel inputs each receiving the output of a differential amplifier through the associated trigger, the whole of these outputs being formed by bits representative of the code of each track for the zone read, and with a series output delivering all the bits corresponding to a relative position of the coded element and of the reading device, as well as an initial additional or starting bit, at least one control unit receiving clock pulses from a clock and transfer pulses, the output of this control unit controlling the operation of the shift register, and means for applying to the photodiodes or the inputs of the differential amplifiers signals adapted to simulate, at the output of the diodes or the input of the amplifiers respectively, at will a bit level "0" or "1".

In the preferred embodiments, the code carrying element is a disk and the reading of the opaque or transparent zones thereof is achieved by diascopy, that is to say by light transmitted or not transmitted through the respectively transparent and opaque zones of the disk.

Advantageously:

the differential amplifier is in actual fact formed by two parallel amplifiers, each receiving the output of one of the two photodiodes of the pair of coupled photodiodes, and by a comparator whose two inputs each receive the output of one of the two above mentioned amplifiers disposed in parallel:

an amplitude shift is provided in the triggering caused by the rising part, on the one hand, and the falling part, on the other, of the signal leaving the differential amplifier, that is to say hysteresis of the comparator, in the preferred embodiment of this differential amplifier;

the shift register comprises a special input, in addition to the inputs fed by the differential amplifiers, particularly the comparators, this special input being supplied so as to produce an initial or starting bit which precedes the information bits in the zones of the coded element effectively read;

the reading device comprises a series transcoder for converting the Gray code into a natural binary code providing, under the control of the control unit, conversion of the Gray code bits leaving the shift register into natural binary code bits available at an output stage of the reading device;

the reading device comprises a parity generator which generates a parity bit ensuring that the number of "1's" transmitted by the shift register to the output stage, possibly through the transcoder transcoding the Gray code into the natural binary code, presents a given parity (this number is effectively even or uneven), this parity bit being introduced after the information bits;

the reading device comprises a programmable counter adapted for choosing the number of useful information bits as a function of the number of tracks effectively read, this counter controlling, when it exists, the parity generator for generating the parity bit at the desired time after the selected number of information bits;

the reading device comprises a buffer memory receiving at its input the most significant bit of the shift register for each succession of bits corresponding to a given position which is read and an output stage, connected to the output of the buffer memory, for outputting this most significant bit, the buffer memory being controlled by the control unit in so far as its output is concerned;

the reading device comprises an assembly of input latches disposed between the output of the differential amplifiers, particularly the comparators, and the input of the shift register so as to be able to transmit the outputs of the differential amplifiers, respectively of the comparators, at a well determined time;

the reading device comprises an inverter for inverting the most significant bit, controllable for causing, when desired, inversion of this bit before it is applied to the shift register.

BRIEF DESCRIPTION OF THE DRAWINGS

The invention will in any case be well understood from the description which follows, as well as from the accompanying drawings which complement the description elements of the drawings are indicated

FIG. 7, finally, shows schematically in the form of blocks a reading device comprising the improvements of the invention, which may be completely integrated, for 12-14 bits, with parallel or series output, the light source not being shown.

DESCRIPTION OF THE PREFERRED EMBODIMENTS

Figure 1:
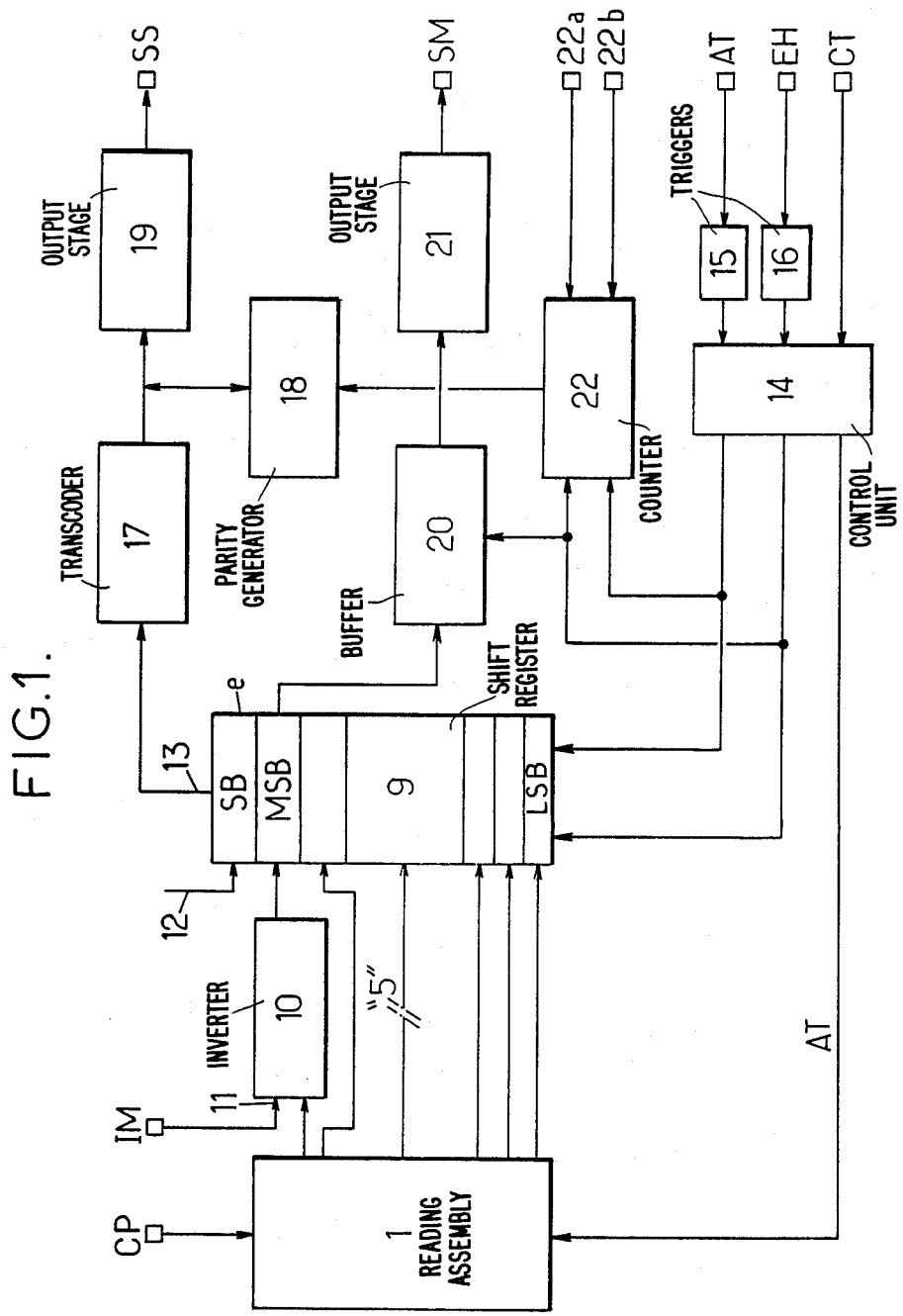
FIG. 1 shows schematically, in the form of blocks, a reading device comprising the improvements of the invention, completely integrable, for 8-10 bits, with series output, the light source not being shown.
Figure 2:
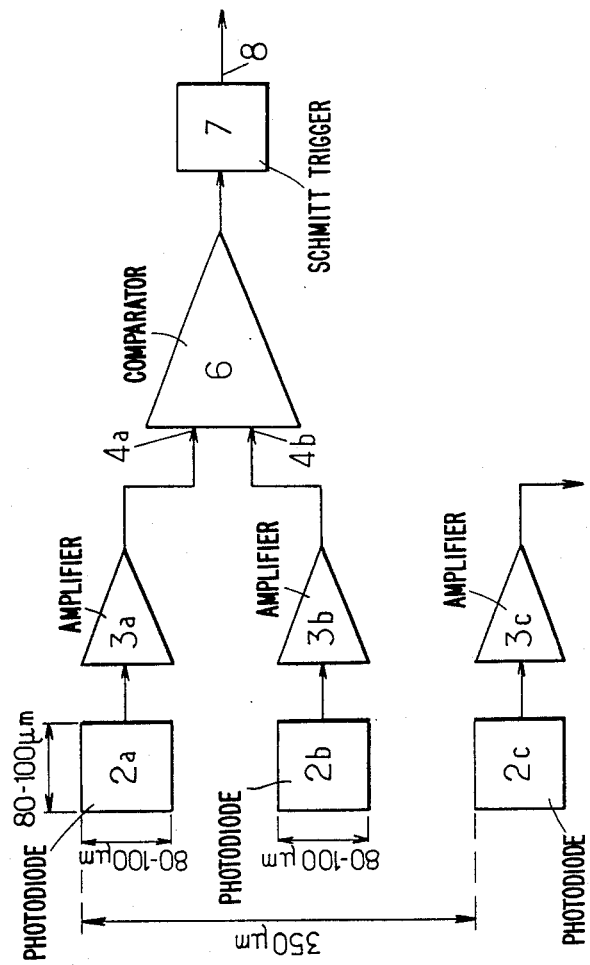
FIG. 2 shows one of the reading channels upstream of the shift register.

Referring first of all to FIGS. 1 and 2, which illustrate respectively the whole and a part of a reading device, completely integrated, for 8-10 bits, with series output, it can be seen that this device comprises a reading assembly with 10 reading channels, one of these channels being shown in detail in FIG. 2.

Each reading channel comprises first of all a pair of photodiodes 2a, 2b, 80 to 100 microns square, working differentially, that is to say one of the diodes 2a reads one of the coded tracks while the other diode 2b reads an associated track carrying zones complementary to the corresponding zones of the first track.

The output of each of diodes 2a, 2b is amplified in an amplifier 3a, 3b and the outputs of the two amplifiers are each connected to an input 4a, 4b of a comparator 6.

The output of comparator 6, which is an alternating signal, is processed by a trigger 7 of the Schmitt trigger type whose output is formed by a rectangular signal.

Comparator 6 comprises a hysteresis for avoiding oscillations in the vicinity of equilibrium, as will now be explained with reference to FIG. 3 and 4.

However, to finish with the description of FIG. 2, a part of a neighboring channel has been shown thereon, namely the photodiode 2c and the amplifier 3c thereof, and the approximative distances concerning the photodiodes have been indicated to show the small amount of space required by the ten pairs of photodiodes. It can in particular be seen that the width of the channel is 350 microns.

Figure 3:
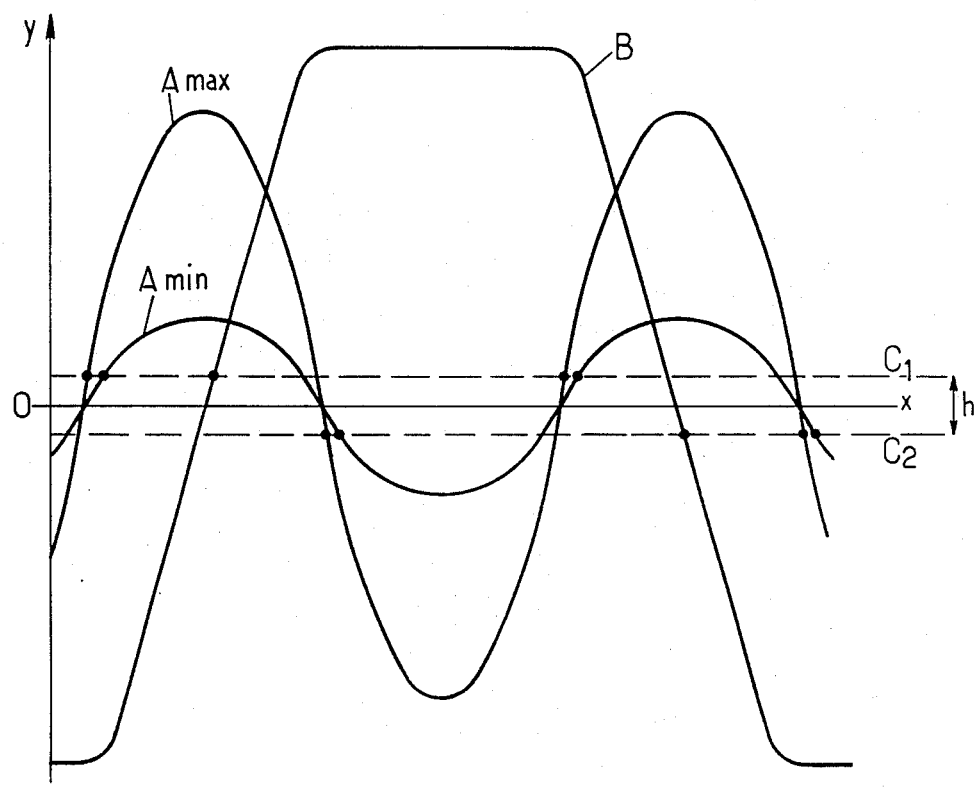
FIG. 3 illustrates signals entering the comparator of FIG. 2.

In FIG. 3 two signals have been illustrated with extreme amplitude Amax and Amin, outputted by the differential amplifier 6 and representing the output of a reading channel. Signal B represents the output of the following channel in the increasing representativity order of the bits and so has a frequency equal to half the frequency of the signal Amax or Amin. It will be noted that the signal B has been clipped of the upper amplitudes in absolute value.

The hysteresis is represented by the amplitude variation h between the switching points of trigger 7 on rising (horizontal $C_1$) and falling (horizontal $C_2$). These two horizontals $C_1$ and $C_2$ are illustrated with broken lines on each side of the axis Ox of the abscissa, the amplitudes being plotted along the ordinate axis Oy. Dots show the crossing of curves Amax, Amin and B with the horizontal $C_1$ on rising and with the horizontal $C_2$ on falling. These are the switching points of trigger 7.

Figure 4:
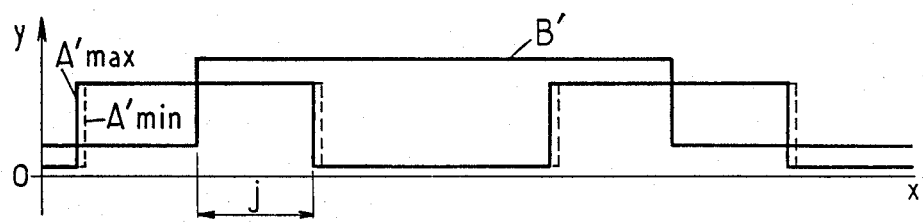
FIG. 4 illustrates pulses leaving the trigger of FIG. 1.

The signals shown in FIG. 3 form the inputs of the triggers or Schmitt triggers 7 of each channel, whereas in FIG. 4 the outputs of these triggers have been shown, which outputs are formed by rectangular signals. At the output of a trigger, Amax has become A'max, whereas Amin has become A'min. It can be readily seen that the maximum amplitude signal A max and the minimum amplitude signal A min are transformed into a signal A' max and a signal A' min respectively, with simply a very slight shift in time, the cyclic ratio for A'max and A'min being independent of the amplitude of the input signal.

FIG. 4 also illustrates the output signal B' of trigger 7 corresponding to the input signal B, B' having a frequency half the frequency of A'max or A'min. It will be noted that in the Gray Code a coder point has a duration equal to half the duration of a signal A'max or A'min; this duration is shown at j in FIG. 4.

We now return to the description of FIG. 1 in which the assembly 1 is formed by ten channels identical to the channel 2a–3a, 2b–3b, 6, 7 of FIG. 2.

On the right of assembly 1 has been shown as a whole five of the ten channels, the five middle channels being shown figuratively by a single horizontal line carrying the indication "5" to show that it concerns five grouped channels.

The ten channels drive the shift register 9, it being understood that the first channel which corresponds to the most significant bit of the Gray code, namely the bit designated generally under the abbreviation MSB, drives the shift register 9 through the inverter 10 which inverts the travel direction of the information, under the control of an inversion terminal IM connected to its input 11. Furthermore, the least significant bit, or LSB, arrives in the last cell of resister 9. Register 9 further comprises an eleventh stage e in which is introduced, through a conductor 12, an initial or starting bit SB.

The shift register 9 in fact receives in parallel the ten information bits from MSB to LSB and the starting bit SB, and it has a series output 13 which delivers these eleven bits successively, namely first of all the starting bit SB then the 10 information bits, MSB being at the front and LSB at the rear. The output of register 9 is controlled by a control unit 14 initiated by a transfer authorization pulse from terminal AT, shaped by a trigger 15 and synchronized by the first clock pulse which arrives at the clock input EH, the clock information also being shaped by a trigger 16 before being processed by the control unit 14.

Figure 5:
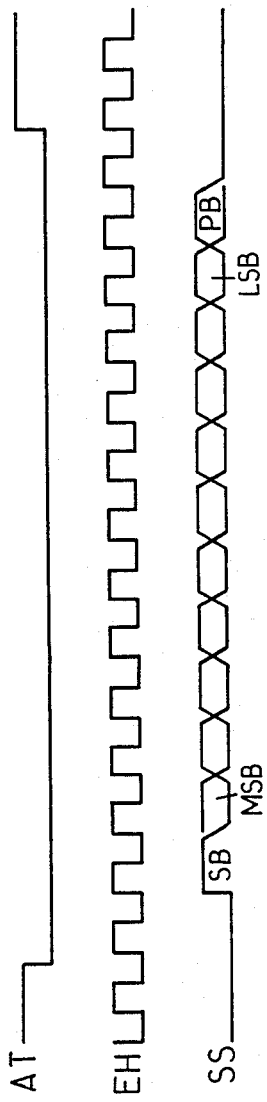
FIG. 5 shows the series output signals during normal operation, as well as the pulses allowing transfer and clock pulses initiating the normal operation of the apparatus.

In FIG. 5 have been shown from top to bottom the transfer authorization pulse AT, the clock pulses EH and the output signal SS of the reading device and therefore comprising successively the starting bit SB, the information bits MSB...LSB and finally a parity bit B whose introduction will be explained hereafter. The output signal from register 9, which is in the Gray code, is converted into the natural binary code in a transcoder 17 which transforms the Gray code into binary code and which is formed by an "exclusive OR" gate.

Furthermore, a parity generator 18 is provided which is also formed by an "exclusive OR" and which generates a parity bit ensuring that the number of "1's" transmitted in the whole of the ten information bits and of the starting bit is always uneven or always even (depending on the choice made). This parity bit serves as control; in fact, if the number of "1's" has not the desired parity, that means that there has been a transmission error. The parity bit is added as 12th bit to the 11 bits leaving the Gray/binary transcoder 17, the whole of the 12 bits arriving at the output stage 19 which delivers the output signal SS of the reading device, which signal SS is illustrated at the bottom of FIG. 5.

Figure 6:
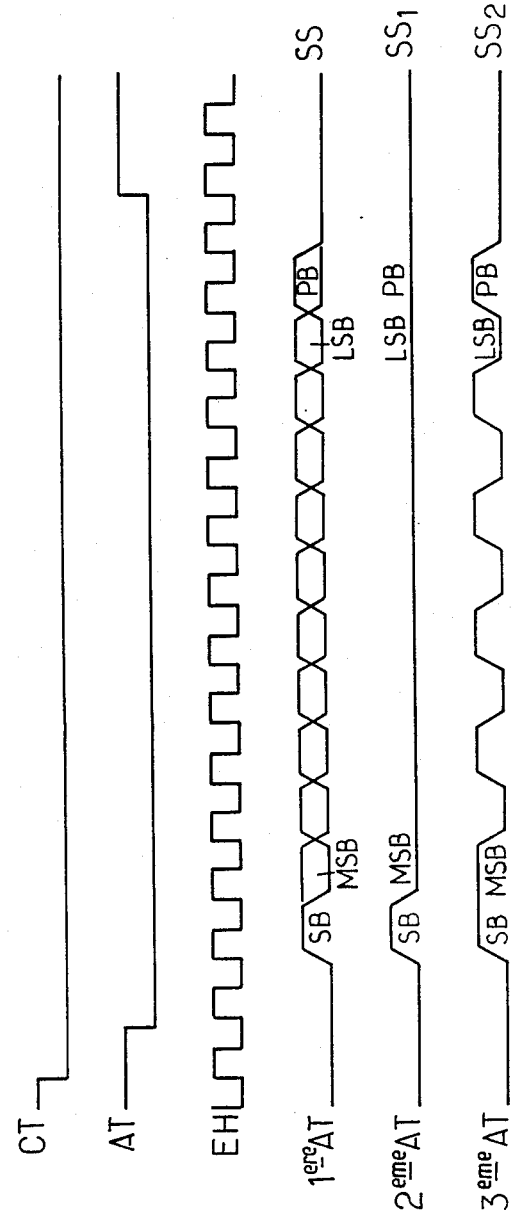
FIG. 6 similarly illustrates the series output signals, the pulses allowing transfer and clock pulses and in addition the control pulses, in the case of operation of the reading device in the test mode.

The control unit 14 is also driven by a test control from terminal CT, which control allows the operation of the reading device to be tested by checking the reception of two characteristic words (a word being formed by the succession of the 12 bits of a signal SS) when the control CT is activated and when it has caused the appearance of three successive transfer authorization pulses AT, as illustrated in FIG. 6 in which are shown the transfer authorization pulses AT and clock pulses EH with, in addition, the test control CT and the three successive pulses AT, the first producing the output signal SS of FIG. 5, whereas the second and third pulses AT produce signals $SS_1$ and $SS_2$ corresponding to the two characteristic words. In fact, the signals AT are applied by the control unit 14 to the initial part of the assembly 1, namely either to the diodes such as 2a and 2b, or to the input of the amplifiers, such as 3a and 3b, so as to cause finally the application to the amplifiers, such as 3a and 3b, of a signal simulating either a "0" bit or a "1" bit.

The reading device of FIG. 1 further comprises advantageously a buffer memory 20 for the most significant bit MSB, which buffer memory is also controlled by the control unit 14 which controls the output of the buffer memory towards an output stage 21 which delivers an output signal SM corresponding to the most significant bit. The information SM allows, in some applications, to cascade several circuits, particularly in the case of multiturn coders.

Finally, the assembly of FIG. 1 advantageously comprises a 8/10 counter referenced 22, which is also controlled by unit 14 and which comprises two programming inputs 22a and 22b for choosing the length of the useful word, that is to say the number of information bits, namely 8 for 22a and 10 for 22b. Counter 22 controls the parity generator 18 so that this latter introduces a parity bit in the correct position of the series signal, namely after the 8th or 10th information bit which forms the effective LSB (up to present the device of FIG. 1 has been described by assuming that we are concerned with words comprising 10 information bits).

In some cases, a control terminal CP may be provided acting on the assembly of channels 1 and which is intended for testing during manufacture of the integrated circuit shown in FIG. 1.

The assembly of the device of FIG. 1 comprises then two outputs, namely the output of stage 19 which gives the signal SS formed successively by a starting bit SB, then by 10 or 8 information bits MSB . . . LSB, and finally a parity bit PB, on the one hand, and the output stage 21, on the other, which delivers a signal SM representing the most significant bit MSB.

It will be noted, as mentioned above, that the travel direction of the information may be inverted, that is to say beginning by the "0" and finishing by the "$2^n-1$" instead of beginning by the "$2^n-1$" and finishing by the "0", by actuating, through the control IM, the inverter 10, without having to change the etching of the Gray code coded disk.

The assembly of FIG. 1 operates in cooperation with a single light emitter, for example an AsGa diode operating in the near infrared and fed with current by a simple resistor connected to the voltage Vcc; this diode illuminates the integrated circuit of FIG. 1 through a suitable optical system and the transparent zones of the disk, the integrated circuit of FIG. 1 being protected either by a coating transparent to infrared, or by being placed in a chip with a glass window.

An integrated circuit such as shown in FIG. 1 has been effectively constructed using bipolar technology on a silicon surface less than 15 mm$^2$. With such an integrated circuit, 100 000 points may be read per second and transmission up to a frequency of 1 MHz (1 M bit per second) may be obtained, the transmission taking place from the output stages 19 and 21 through the usual means.

Referring to FIG. 7 a reading device will now be described entirely integrated for 12 to 14 bits, comprising a parallel output and a series output.

The device comprises first of all a reading assembly 1a, similar to the reading assembly 1 of FIG. 1, that is to say comprising for each channel an assembly such as shown in FIG. 2, apart from the fact that assembly 1a is provided for 14 reading channels, whereas assembly 1 of FIG. 1 is provided for ten channels.

The 14 channel output, that is to say comprising 14 bits from the most significant bit MSB to the least significant LSB of the bits leaving assembly 1a, arrive at a 14 bit input latch 23, storing the 14 bits and latching the information read from the coded disk, independently of the transmission from the reading device of FIG. 7. Thus for example, in the case of a robot comprising several coded disks for detecting the angular position of several elements, the readings of the different coded disks may be stored at the same time, then be transmitted so that the data processing unit receives each time the position of all the members moving at the same time.

The output of latch 23 is transmitted to a 14 bit Gray/binary transcoder 17a operating in parallel, noting however, that the MSB, before being applied to the transcoder 17a, passes through an inverter 10a controllable by an inversion input IM, so as to be able to obtain, when desired,—because of the very structure of the Gray code—a reversal of the direction in which the information appears.

The output of transcoder 17a, in natural binary form, is normally formed by 14 parallel bits, namely MSB, (channel 1 marked V1), 11 bits forming channels V2 to V12, and finally if required two other bits by channels V3 and V14 (it will be seen hereafter that the passage from 12 to 14 bits may be made at will).

The 12 to 14 bits arrive finally in the shift register 9a, similar to the shift register 9 of FIG. 1, but comprising 16 parallel inputs and a double output, namely a series output and in addition a parallel output, these outputs driving respectively the output stages 19a for the series output and 19b for the parallel output. The shift register comprises an additional stage receiving, through the input 12a, an initial starting bit SB, this initial bit only being transferred to the series output 19a and in this case at the head of the information bits MSB to LSB, so as to form an output signal SS of the type shown in FIG. 5, apart from the fact that the number of information bits is higher.

As in the embodiment shown in FIG. 1, a special output may be provided for the MSB bit, which, through buffer memory not shown, arrives from the output of inverter 10a to the output stage 21a corresponding to the output stage 21 of FIG. 1.

As for the parallel output 19b, it is formed by a parallel output "port" of the three stage 15-bit type (14 information bits and 1 parity bit which will be discussed hereafter).

In place of the control unit 14 of FIG. 1, the device of FIG. 7 comprises three control units, namely a sequencer 14a, a programmer 14b and a test unit 14c.

The sequencer 14a, which organizes the operation of the circuit of FIG. 7, receives through triggers 15a and 16a respectively the transfer authorization pulses AT and the clock pulses EH. It further receives measurement request pulses DM and control pulses CB controlling the three state output, for the parallel output 19b.

Programmer 14b allows the device of FIG. 7 to be conditioned so that it may operate with 12, 13 or 14 bits. For this, it has three inputs 22c, 22d and 22e, on the one hand, and a programming terminal IP, on the other, which allows the parity to be inverted and it is under the control of the sequencer 14. This programmer is also connected to the parity generator 18a by three connections corresponding to the choice of 12, 13 and 14 bits and referenced S12, S13 and S14, and it controls register 9a through three connections corresponding to the choice of 14, 15 and 16 bits and designated respectively T12, T13, T14. The programmer controls the transfer of the bits of rank 12, 13 and 14 and the introduction, by unit 18a of the parity bit after the 12th, 13th or 14th information bit.

As for the test unit 14c, whose inputs are connected to terminals AT and EH through triggers 15a and 16a, it comprises a third input controlling a test control CT. The test unit 14c acts on the initial part of channels 1a for controlling the simulation of the "1" or "0" bits at the inputs of the amplifiers such as 2a and 2b in FIG. 2.

Finally, the device of FIG. 7 may comprise the three following units:

an internal clock 24 with input SH, which may drive the input terminal EH directly;

a tachometer 25 receiving the output from channels 13 and 14, referenced V13 and V14, of unit 1a and delivering to a terminal TA the relative rotational speed of the device, which additional information may be interesting in some cases and which is obtained without requiring a special tachometric system, as is the case with the code reading devices of the prior art;

a unit 26 which also receives channels V13 V14 for detecting the relative direction of movement of the coded disk, this indication being available as DS at the output of unit 26.

It will be noted that the frequency of the pulses is doubled by an "exclusive OR" integrated in each of the units 25 and 26.

As in the case of the device of FIG. 1, a light emitter with its optical system must be added to the device of FIG. 7.

The circuit of Figure accomplishes all the functions indicated above for the device of FIG. 1 with, in addition, the function of determining the direction of rotation and the speed of rotation.

Formed with CMOS technology, a device of FIG. 7 has low consumption and may be constructed on a silicon surface of only 15 mm$^2$. It allows more than 100,000 points to be read per second with outputting of the information in two microseconds in parallel and/or series transmission up to a speed of 1 Mbit per second.

It can then be seen that the invention provides an optical reading device completely integrated on one or possibly a small number of chips occupying much reduced space and at a much reduced cost and with very high reliability and safety. Furthermore, the circuit may provide additional functions such as a circuit testing function and also determining the direction of the speed of rotation.

A device of the invention may be applied more particularly to the circuits described in the French patent applications of the applicant No. 83 06482 filed on the Apr. 20, 1984 and No. 84 10689 filed on the July 5, 1984, as well as No. 84 19711 and No. 84 19713, these latter two filed on the Dec. 21, 1984 each comprising an optoelectronic reader 10 which may be constructed as described above.

As is evident and as it follows moreover already from what has gone before, the invention is in no wise limited to those of its modes of application and embodiments which have been more especially considered; it embraces, on the contrary, all variants thereof.

What is claimed is

1. An optical code reading apparatus for cooperating with a code-caryring element which is in relative movement with respect to said reading device, said code-carrying element including a first series of n coded tracks, with a succession of elementary zones of two different types of light retransmission, and a second series of n coded tracks, each of said second series of n coded tracks being coded in one of said two types different from the type of coding used in a corresponding track among the tracks of the first series, said apparatus comprising:

illuminating means, including a single light source for illuminating said first and secodn series of tracks; and illumination determining means, carried by 1 to p chips (p being a small integer), for determining whether light originating from said illuminating means is retransmitted or not by an observed elementary zone of each of said tracks of said first and second series of tracks, said illumination determining means including for each of said tracks of said first and second series of tracks a first and second photodiode, a differential amplifier having an output and a first and a second input, said first and second input of said differential amplifier being connected respectively to said first photodiode and said second photodiode, and a trigger having an output and an input, said input of said trigger being connected to the output of said differential amplifier for imparting a steep leading edge to the signals received therefrom, a shift register having a series of inputs, each of said inputs of said shift register being connected to an output of an associated trigger, wherein parallel signals from the outputs of said plurality of triggers are formed by the bits representing the code of each track for the elementary zone read, and a single output delivering serially all the bits corresponding to a relative position of said coded element to said reading device, as well as an additional initial or starting bit, a clock for delivering clock pulses, means for delivering transfer pulses, at least one control unit having at least one input being connected to receive said clock pulses from said clock and said transfer pulses from said delivering means, and an output being connected to a further input of said shift register for controlling the operation thereof, and means for generating signals reaching the inputs of said differential amplifiers for simulating, at the output thereof, a bit level "0" or a bit level "1" upon request.

2. The apparatus as claimed in claim 1, wherein said code-carrying element is a disk with two series of n transparent and opaque zones, reading of the opaque and transparent zones permitting said apparatus to determine whether light is transmitted or not by said zones.

3. The apparatus as claimed in claim 1, wherein each differential amplifier includes two amplifiers in parallel, each amplifier having an output and an input, said input of said amplifier being connected to the output of one of the two photodiodes of said pair of photodiodes and a comparator having an output and two inputs, each input of said comparator being connected to the output of one of said two amplifiers in parallel.

4. The apparatus as claimed in claim 1, wherein amplitude-shifting means are provided for producing an amplitude shift in the switching caused by the rising part and by the falling part of a signal originating from said differential amplifier.

5. The apparatus as claimed in claim 3, wherein amplitude-shifting means are provided for producing an amplitude shift in the switching caused by the rising part and by the falling part of a signal originating from said differential amplifier and wherein said amplitude-shifting means provide a hysteresis in said comparator.

6. The apparatus as claimed in claim 1, wherein said shift register comprises a special input, in addition to the inputs connected to said differential amplifiers, said special input being supplied so as to produce an initial or starting bit which precedes information bits representing the elementary zones, of said tracks of said coded element, which are effectively read.

7. The apparatus as claimed in claim 1, wherein said tracks are coded in Gray code and further including a series transcoder for converting the Gray code into natural binary code and providing, under control of a control unit, conversion of Gray code bits leaving the shift register into natural binary code bits available at the output of said reading apparatus.

8. The apparatus as claimed in claim 1, wherein said tracks are coded in Gray code and further including a parallel transcoder for converting the Gray code into natural binary code and providing conversion of Gray code bits leaving the triggers into natural binary code bits available at the output of said reading apparatus.

9. The apparatus as claimed in claim 1, further including a parity generator which generates a parity bit ensuring that the number of "1s" transmitted by said shift register to the output of said reading device presents a given parity (said number being effectively even or uneven), said parity bit being inserted after corresponding information bits.

10. The apparatus as claimed in claim 1, further including a programmable counter for choosing the number of useful information bits as a function of the number of tracks effectively read.

11. The apparatus as claimed in claim 9, further including a programmable counter for choosing the number of useful information bits as a function of the number of tracks effectively read, and wherein said programmable counter controls said parity generator for generating the parity bit at the desired time after the selected number of information bits.

12. The apparatus as claimed in claim 1, further including a buffer memory having an input and an output, said input of said buffer memory receiving the most significant bit from said shift register for each succession of bits corresponding to a given relative position which is read and an output stage being connected to the output of said buffer memory, for outputting said most significant bit, said buffer memory being controlled by said control unit to control its output.

13. The apparatus as claimed in claim 1, further including an assembly of input latches disposed between the output of said differential amplifiers and the input of said shift register, so as to be able to transmit the outputs of said differential amplifiers at a well defined moment.

14. The apparatus as claimed in claim 1, further including an inverter for inverting the most significant bit and controllable for causing, when instructed, inversion of this bit before it is applied to said shift register.

* * * * *